United States Patent [19]

Tsujimoto

[11] Patent Number: 5,627,792

[45] Date of Patent: May 6, 1997

[54] LOC TYPE SEMICONDUCTOR MEMORY DEVICE

[75] Inventor: Akira Tsujimoto, Tokyo, Japan

[73] Assignee: NEC Corporation, Tokyo, Japan

[21] Appl. No.: 548,948

[22] Filed: Oct. 27, 1995

[30] Foreign Application Priority Data

Oct. 27, 1994 [JP] Japan ..................... 6-263634

[51] Int. Cl.$^6$ ................. G11C 8/00; G11C 5/06
[52] U.S. Cl. .................. 365/230.03; 365/51; 365/63
[58] Field of Search ................. 365/230.03, 63, 365/51

[56] References Cited

U.S. PATENT DOCUMENTS 5,208,782  5/1993  Sakuta et al. ............... 365/63
5,251,168  10/1993  Chung et al. ................ 365/51

*Primary Examiner*—Son T. Dinh
*Attorney, Agent, or Firm*—Foley & Lardner

[57] ABSTRACT

In a semiconductor memory device including two rows, two columns of memory cell arrays, a data input/output circuit including its pads and a control signal circuit and its pads are arranged between one column of the memory cell arrays, and address signal circuits including their pads are arranged outside of the other column of the memory cell arrays.

9 Claims, 7 Drawing Sheets

LOC TYPE SEMICONDUCTOR MEMORY DEVICE

BACKGROUND OF THE INVENTION

1. Field of the Invention

The present invention relates to a lead on chip (LOC) type semiconductor memory device.

2. Description of the Related Art

An LOC assembling technology, which can mount a large size chip on a small package, has been broadly used in 16 Mbit dynamic random access memory (DRAM) devices or the like.

In a first prior art semiconductor memory device including two rows, two columns of memory cell arrays, a data input/output circuit including its pads and control signal pads are arranged between one column of the memory cell arrays, and address signal circuits including their pads are arranged between the other column of the memory cell arrays. This will be explained later in detail.

In the above-described first prior art LOC type semiconductor memory device, however, bonding wires for connecting data input/output pads, control signal pads and address signal pads to their leads (or pins) cross a power supply lead or a ground lead. As a result, the data imput/output leads, the control signal leads and the address signal leads may be short-circuited to the power supply lead or the ground lead.

In order to avoid the above-mentioned short circuit between the leads, in a second prior art semiconductor memory device including two rows, two columns of memory cell arrays, a data input/output circuit including its pads and control signal pads are arranged outside of one column of the memory cell arrays, and address signal circuits including their pads are arranged outside of the other column of the memory cell arrays. This will also be explained later in detail.

In the above-described second prior art LOC type semiconductor memory device, however, since the control signal pads are separated, at two locations, the control signal circuit has to be located at the center of the control signal pads. As a result, a signal path between the data input/output circuits and the control signal pads via the control signal circuit is so long that it increases an access time.

SUMMARY OF THE INVENTION

It is an object of the present invention to avoid short-circuit in an LOC type semiconductor memory device without increasing the access time thereof.

According to the present invention, in a semiconductor memory device including two rows, two columns of memory cell arrays, a data input/output circuit including its pads and control signal circuit and its pads are arranged between one column of the memory cell arrays, and address signal circuits including their pads are arranged outside of the other column of the memory cell arrays. That is, the advantage of the first prior art LOC type semiconductor memory device is combined with the advantage of the second prior art LOC type semiconductor memory device.

BRIEF DESCRIPTION OF THE DRAWINGS

The present invention will be more clearly understood from the description as set forth below, in comparison with the prior art, with reference to the accompanying drawings, wherein.

DESCRIPTION OF THE PREFERRED EMBODIMENT

Before the description of the preferred embodiment, prior art LOC type semiconductor memory devices will be explained with reference to FIGS. 1 to 5.

Figure 1:
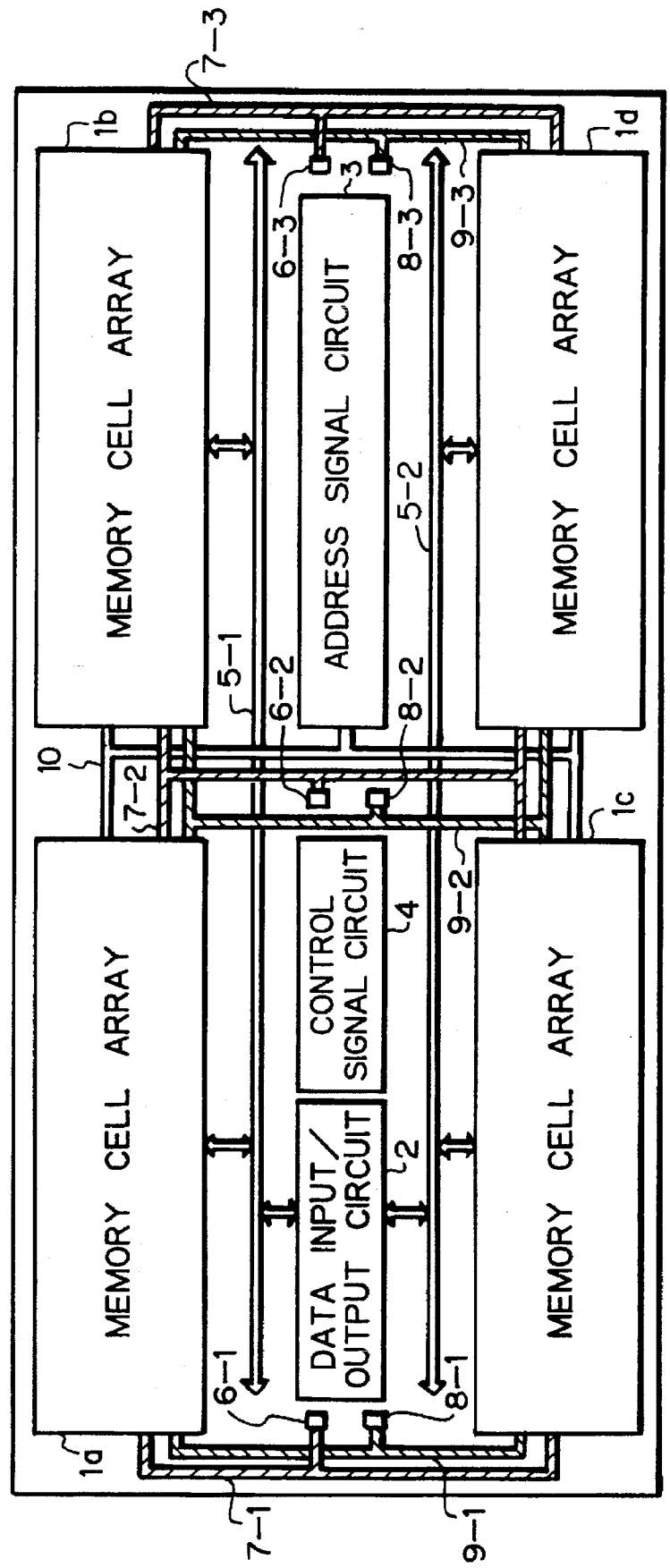
FIG. 1 is a chip layout diagram illustrating a first prior art LOC type semiconductor memory device.

In FIG. 1, which illustrates a first prior art LOC type semiconductor memory device, memory cell arrays 1a, 1b, 1c and 1d are arranged in two rows, and two columns. Each of the memory cell arrays includes a plurality of word lines, a plurality of bit lines, a plurality of memory cells each connected to one of the word lines and one of the bit lines, sense amplifiers for amplifying a small difference in potential, row decoders, column decoders and the like.

Provided between the memory cell arrays 1a and 1c is a data input/output circuit 2 including its pads which carries out a level conversion and a timing control with an external circuit. Also, provided between the memory cell arrays 1b and 1d is an address signal circuit 3 including its pads which converts a level of an external address signal into a complementary metal oxide semiconductor (CMOS) level and latches it to generate an internal address signal. Further, provided between the memory cell arrays 1a and 1c is a control signal circuit 4 including its pads which carries out an input/output control (external read/write control) for the data input/output circuit 2 and an input/output control (internal read/write control) for the address signal circuit 3. The control signal circuit 4 receives a variety of control signals such as a row address strobe signal $\overline{RAS}$, a column address strobe signal $\overline{CAS}$, a write enable signal $\overline{WE}$ and an output enable signal $\overline{OE}$.

Data of the memory cell arrays 1a and 1b is read and is transmitted via a data bus 5-1 to the data input/output circuit 2. On the other hand, data of the memory cell arrays 1c and 1d is read and is transmitted via a data bus 5-2 to the data input/output circuit 2. The data input/output circuit 2 is controlled by the control signal circuit 4, so that the data of the data input/output circuit 2 is output from the pads thereof.

The data buses 5-1 and 5-2 are arranged between the memory cell arrays 1a, 1b, 1c and 1d and the data input/output circuit 2.

Also, three power supply pads 6-1, 6-2 and 6-3 are provided, so that a power supply voltage is applied from the power supply pads 6-1, 6-2 and 6-3 via metal connections 7-1, 7-2 and 7-3 to the memory cell arrays 1a, 1b, 1c and 1d. Similarly, three ground pads 8-1, 8-2 and 8-3 are provided, so that a ground supply voltage is applied from the power supply pads 8-1, 8-2 and 8-3 via metal connections 9-1, 9-2 and 9-3 to the memory cell arrays 1a, 1b, 1c and 1d. The power supply pads 6-1, 6-2 and 6-3 are located in the proximity of the ground pads 8-1, 8-2 and 8-3, respectively.

Reference numeral 10 designates an address bus arranged between the memory cell arrays 1a, 1b, 1c and 1d and the address signal circuit 3.

Figure 2:
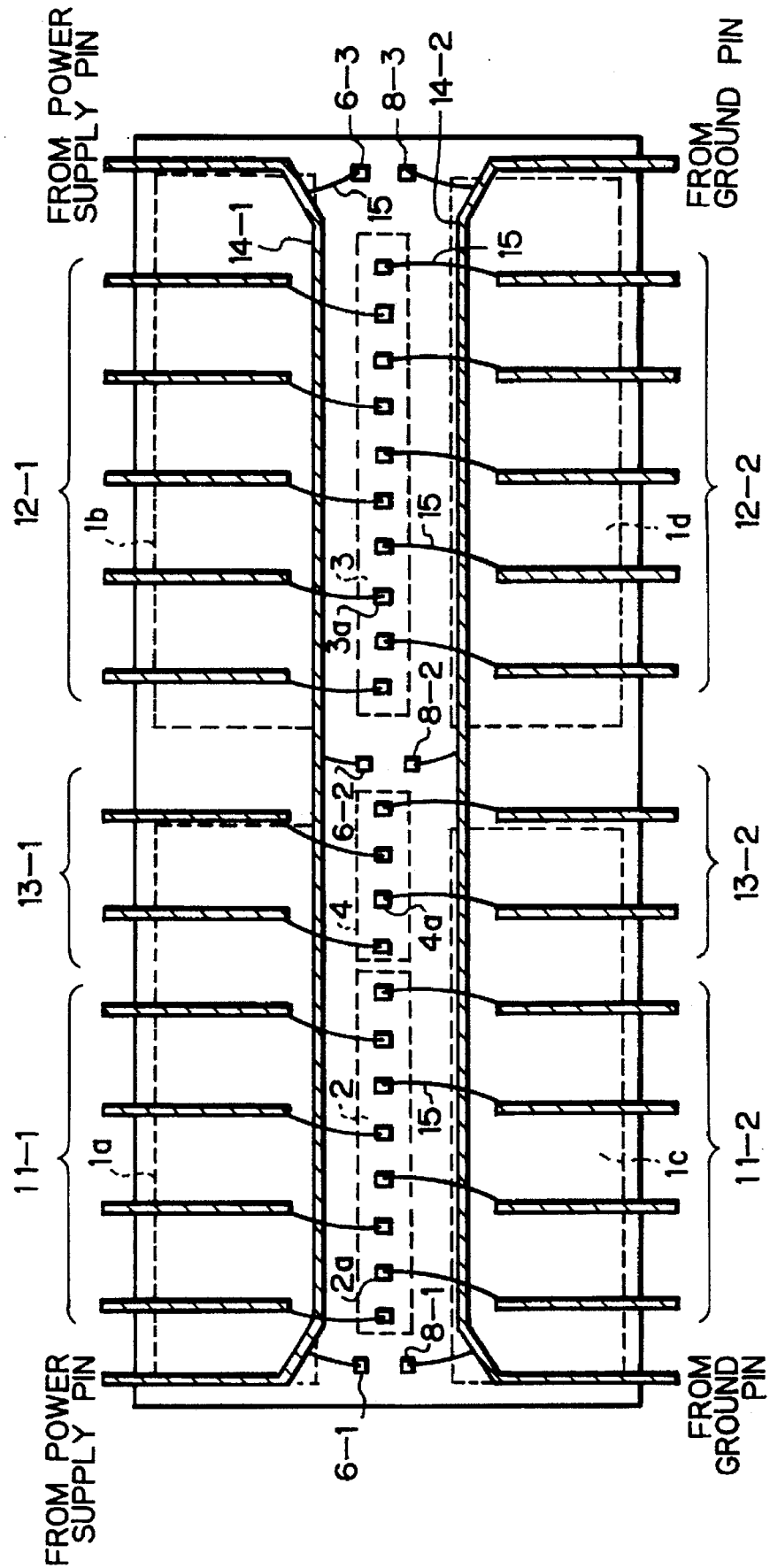
FIG. 2 is a plan diagram of the leads of the device of FIG. 1.

In FIG. 2, which illustrates the leads of the device of FIG. 1, leads (or pins) 11-1, 11-2, 12-1, 12-2, 13-1, 13-2, 14-1 and 14-2 of a lead frame are illustrated. The leads 11-1 and 11-2 are connected by bonding wires 15 to pads 2a of the data input/output circuit 2, the leads 12-1 and 12-2 are connected by bonding wires 15 to pads 3a of the address signal circuit 3, and the leads 13-1 and 13-2 are connected by bonding wires 15 to pads 4a of the control signal circuit 4. Also, the lead 14-1 is connected by bonding wires 15 to the power supply pads 6-1, 6-2 and 6-3, and the lead 14-2 is connected by bonding wires 15 to the ground pads 8-1, 8-2 and 8-3. In this case, the number of the power supply pads is three and the number of the ground pads is three, so that a power supply noise and a ground noise can be suppressed in a 64 Mbit DRAM device or the like where the area of a semiconductor chip is 180 mm². Contrary to this, only two pins are provided for each of the power supply voltage and the ground voltage in a JEDEC standard. Thus, the leads 14-1 and 14-2 extend and pass between the memory cell arrays 1a and 1c and between the memory cell arrays 1c and 1d.

Thus, in FIGS. 1 and 2, since all the pads 2a, 3a and 4a are concentrated on a center portion surrounded by the memory cell arrays 1a and 1c and by the memory cell arrays 1b and 1d, the control signal pads 4a can be close to the data input/output circuit 2, which increases an access speed. Also, since the data buses 5-1 and 5-2 are concentrated on the center portion, the read/write speed can be equalized regardless of the memory cell arrays 1a, 1b, 1c and 1d.

Figure 3:
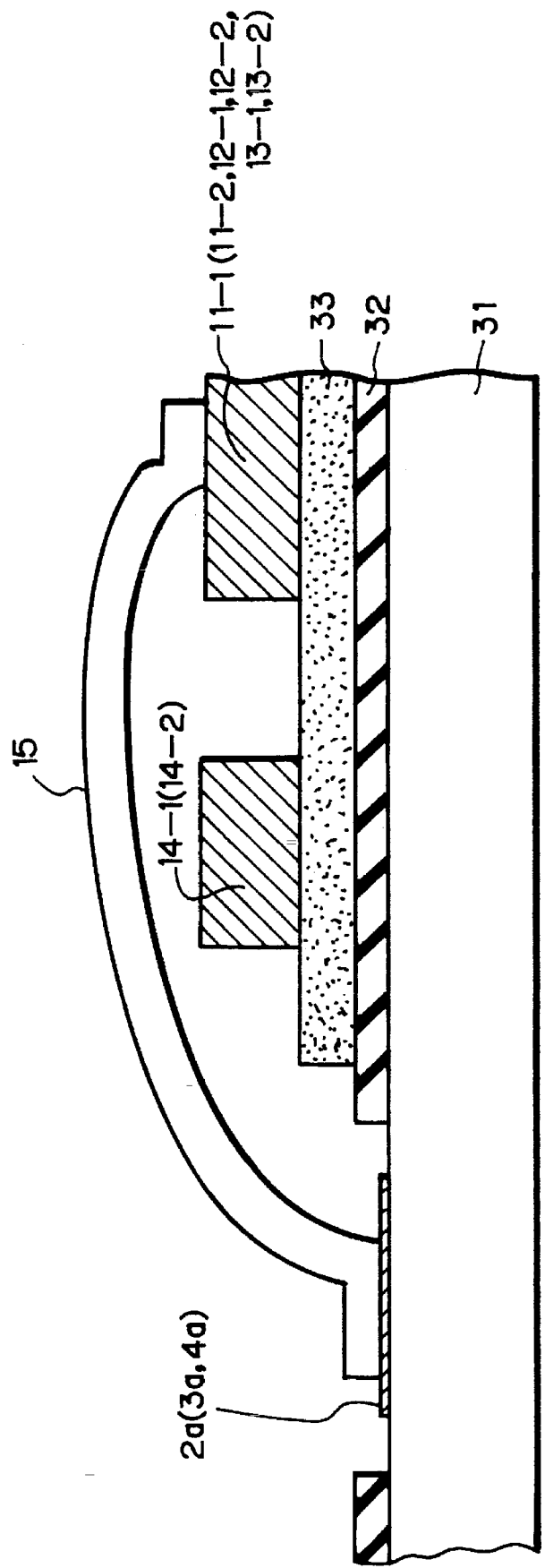
FIG. 3 is a partial cross-sectional view of the device of FIG. 2.

In FIGS. 1 and 2, however, a short-circuit may by created. That is, as shown in FIG. 3, the leads 11-1 (11-2, 12-1, 12-2, 13-1 or 13-2) and 14-1 (or 14-2) are formed on a silicon substrate 31 via a waterproof cover layer 32 made of silicon nitride and an adhesive tape 33 made of polyimide. In this case, the bonding wire 15 linking the lead 11-1 (11-2, 12-1, 12-2, 13-1, 13-2) to the pad 2a (3a or 4a) crosses the lead 14-1 (or 14-2), and as a result, the lead 11-1 (11-2, 12-1, 12-2, 13-1 or 13-2) may be short-circuited to the lead 14-1 (or 14-2), thus reducing the manufacturing yield.

In order to increase the manufacturing yield, a precise wire bonding system is required. Particularly, in a thin single outline package (TSOP) system, for example, the thickness of the silicon substrate 31 is about 350 to 400 μm, the thickness of the cover layer 32 and the adhesive layer 33 is about 100 μm, and the thickness of the leads 11-1 and 14-1 is about 1 m. Therefore, a strict wire bonding precision is required.

Figure 4:
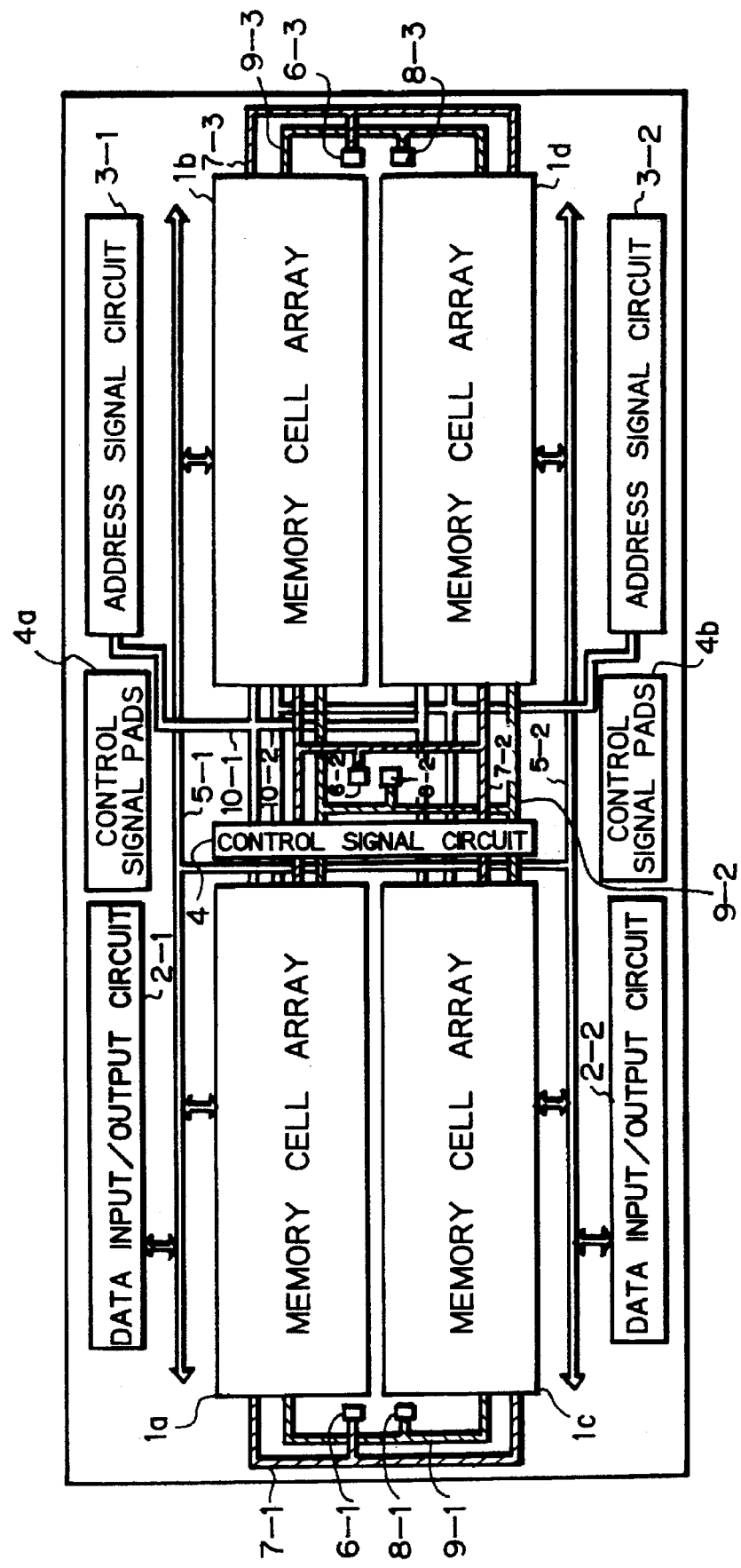
FIG. 4 is a chip layout diagram illustrating a second prior art LOC type semiconductor memory device.
Figure 5:
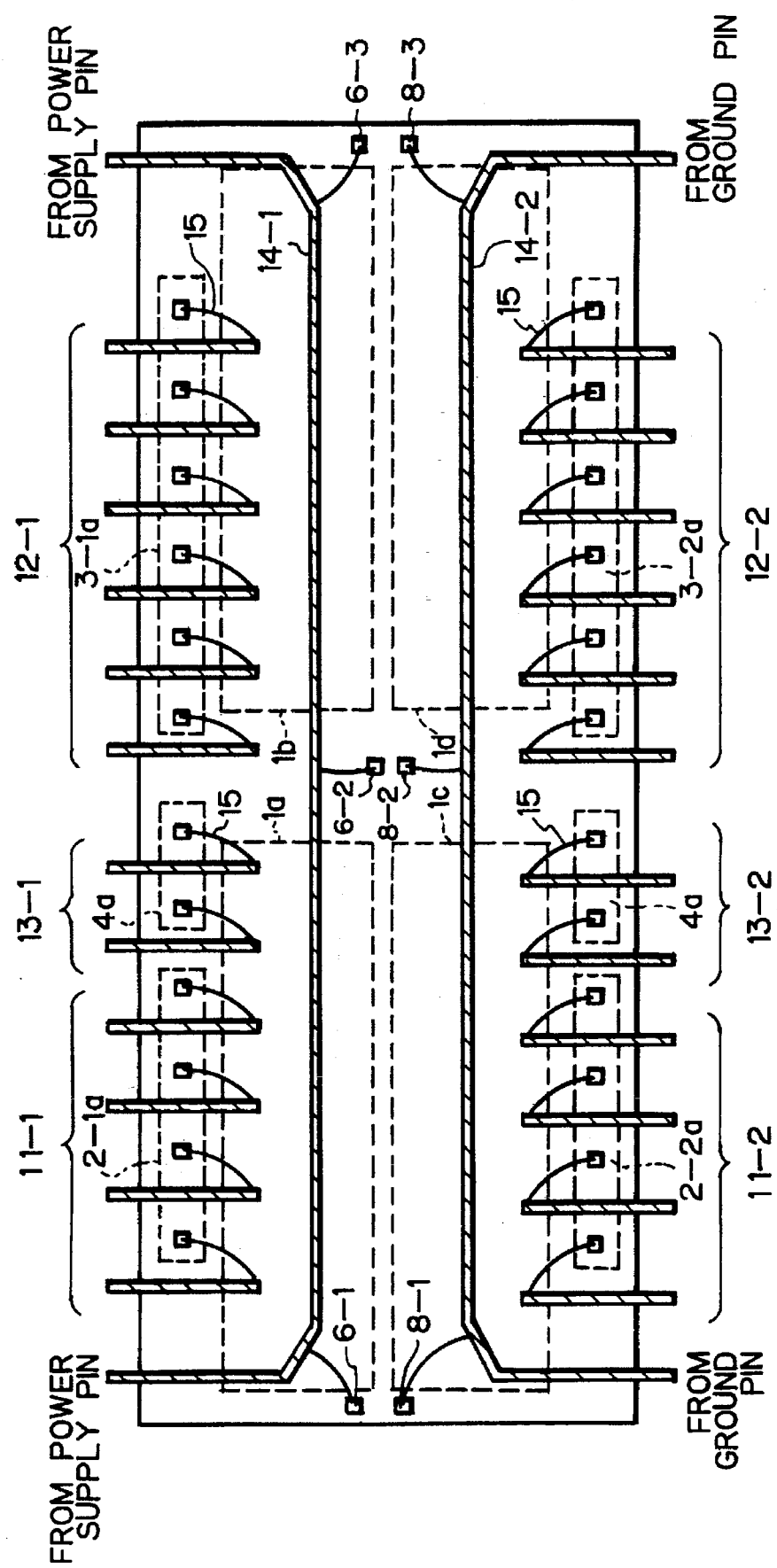
FIG. 5 is a plan diagram of the leads of the device of FIG. 4.

In order to avoid a short-circuit in the first prior art LOC type semiconductor device, a second prior art LOC semiconductor memory device as illustrated in FIGS. 4 and 5 is known.

That is, in FIG. 4, the data input/output circuit 2 of FIG. 1 is divided into two data input/output circuits 2-1 and 2-2 which are outside of the memory cell arrays 1a and 1c, and also, the data buses 5-1 and 5-2 are moved to the outside of the memory cell arrays 1a and 1c. Similarly, the address signal circuit 3 of FIG. 1 is divided into two address signal circuits 3-1 and 3-2 which are outside of the memory cell arrays 1b and 1d, and the address bus 10 of FIG. 1 is divided into two address buses 10-1 and 10-2 which are both connected to the memory cell arrays 1a, 1b, 1c and 1d. Further, the control signal pads of the control signal circuit 4 are separated at two locations as indicated by 4a and 4b outside of the memory cell arrays 1a and 1c, but the control signal circuit 4 is located at a center location.

As a result, as illustrated in FIG. 5, the bonding wire 15 linking the lead 11-1 (11-2, 12-1, 12-2, 13-1, 13-2) to the pad 2a (3a or 4a) never crosses the lead 14-1 (or 14-2), and as a result, the lead 11-1 (11-2, 12-1, 12-2, 13-1 or 13-2) never short-circuited to the lead 14-1 (or 14-2), thus increasing the manufacturing yield.

In FIGS. 4 and 5, however, since the control signal pads 4a and 4b are separated at two locations, the control signal circuit 4 has to be located at the center of the control signal pads 4a and 4b. As a result, a signal path between the data input/output circuits 2-1 and 2-2 and the control signal pads 4a and 4b via the control signal circuit 4 is long so as to increase an access time. Also, since the data buses 5-1 and 5-2 are located on both sides of the memory cell arrays 1a, 1b, 1c and 1d, a data read/write speed is dependent upon the location of the memory cell array to be accessed, which is disadvantageous in a memory device of a 1-bit word configuration or a multi-bank synchronous DRAM device where each memory cell array serves as an independent bank.

Figure 6:
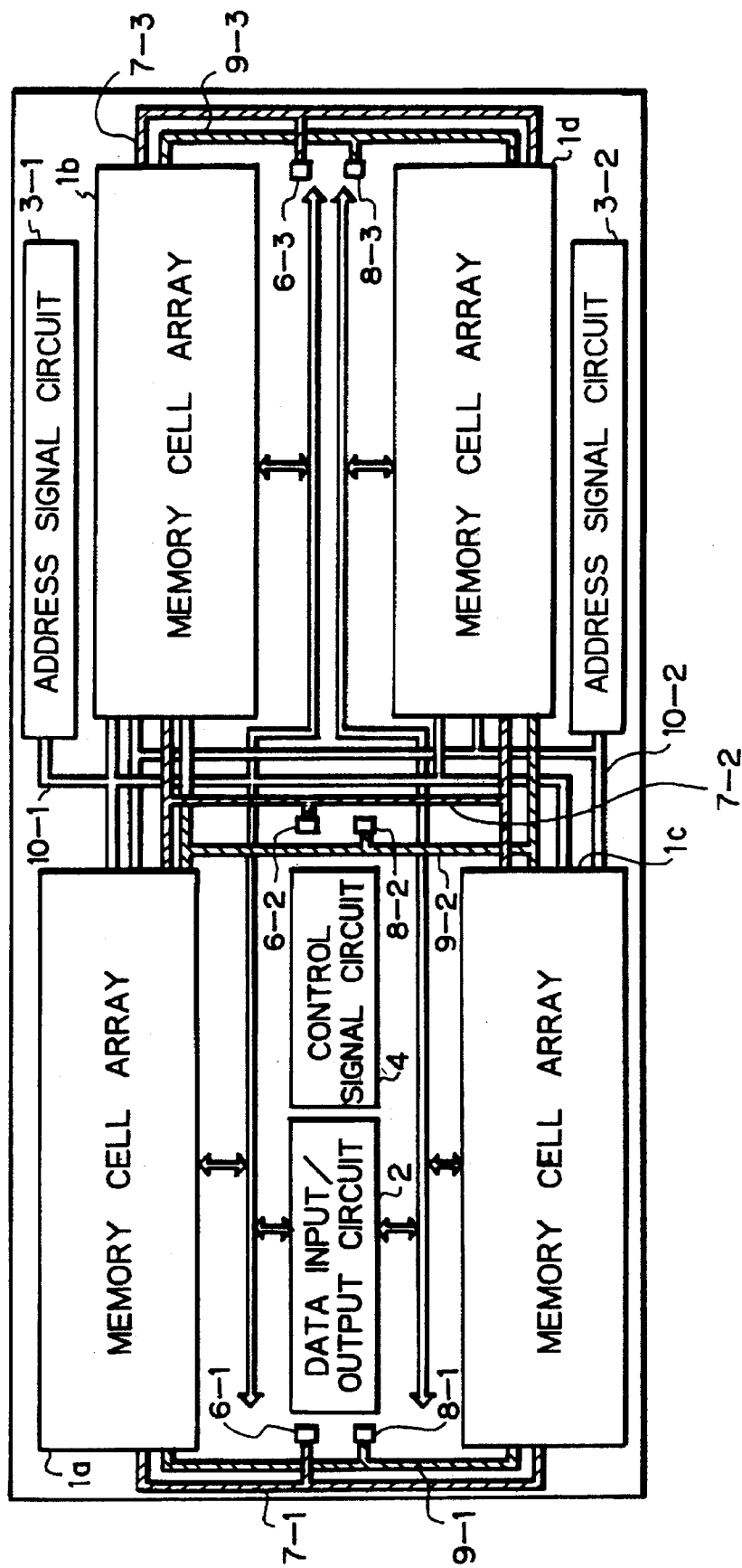
FIG. 6 is a chip layout diagram illustrating an embodiment of the LOC type semiconductor memory device according to the present invention.

In FIG. 6, which illustrates an embodiment of the present invention, the address signal circuit 3 of FIG. 1 is divided into two address signal circuits 3-1 and 3-2 which are outside of the memory cell arrays 1b and 1d, and the address bus 10 of FIG. 1 is divided into two address buses 10-1 and 10-2 which are both connected to the memory cell arrays 1a, 1b, 1c and 1d. However, the data input/output circuit 2 and the control signal circuit 4 of FIG. 1 are not changed. As a result, the distance between the memory cell arrays 1a and 1c is larger than the distance between the memory cell arrays 1b and 1d.

Figure 7:
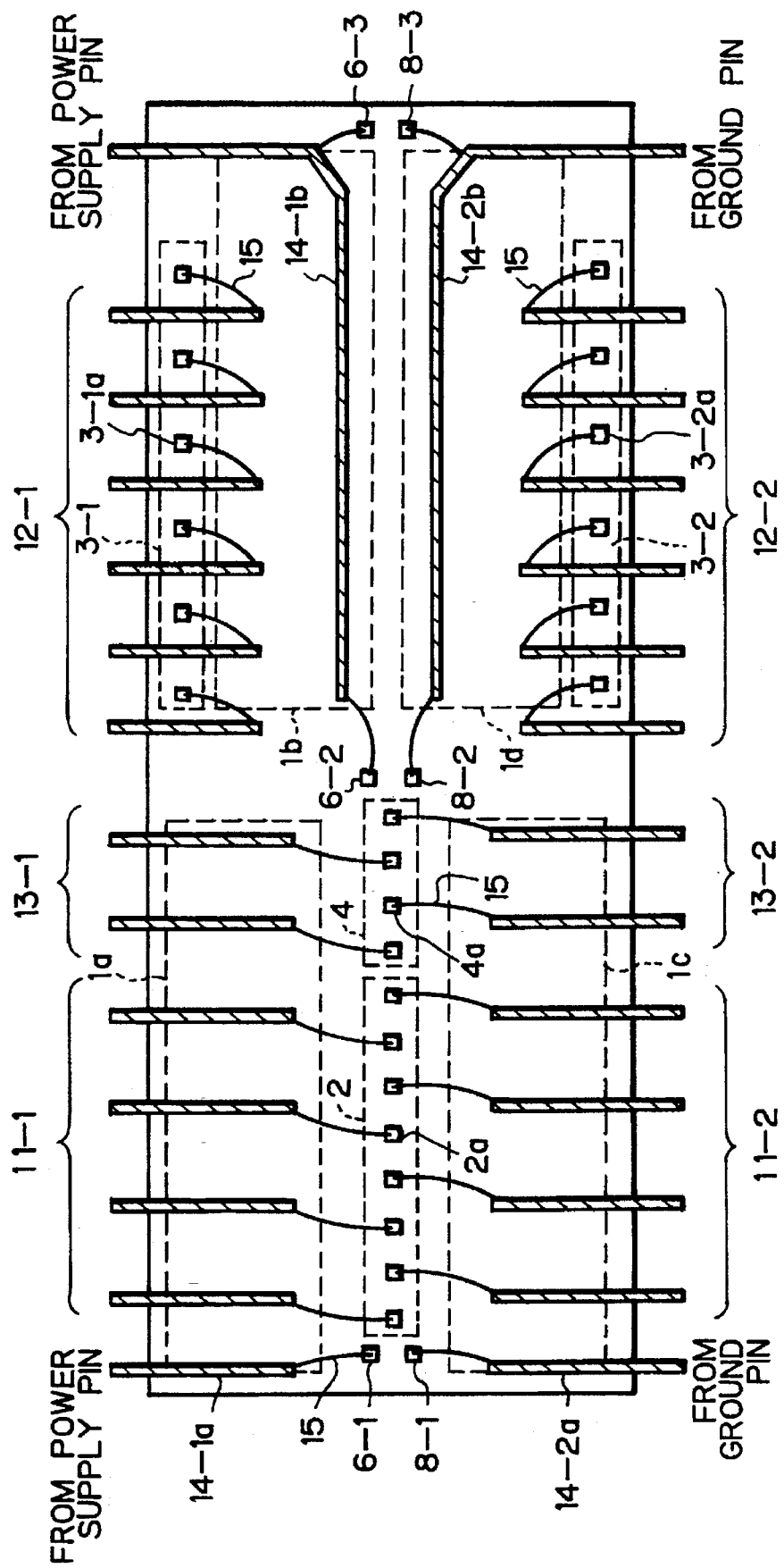
FIG. 7 is a plan diagram of the leads of FIG. 6.

In FIG. 7, the lead 14-1 of FIG. 2 is separated into leads 14-1a and 14-1b. The lead 14-1a is arranged approximately outside of the memory cell array 1a and is connected by a bonding wire 15 to the power supply pad 6-1. On the other hand, the lead 14-1b extends from the outside of the memory cell array 1b to a space between the memory cell arrays 1b and 1d, so that the lead 14-1b extends from the neighborhood of the power supply pad 6-2 to the neighborhood of the power supply pad 6-3. Thus, the lead 14-1b is connected by bonding wires 15 to the power supply pads 6-2 and 6-3. Similarly, the lead 14-2 of FIG. 2 is separated into leads 14-2a and 14-2b. The lead 14-2a is arranged approximately outside of the memory cell array 1c and is connected by a bonding wire 15 to the ground pad 8-1. On the other hand, the lead 14-2b extends from the outside of the memory cell array 1d to a space between the memory cell arrays 1b and 1d, so that the lead 14-2b extends from the neighborhood of the ground pad 8-2 to the neighborhood of the ground pad 8-3. Thus, the lead 14-2b is connected by bonding wires 15 to the ground pads 8-2 and 8-3.

As illustrated in FIG. 7, the bonding wires 15 of the leads 11-1 (11-2, 12-1, 12-2, 13-1 or 13-2) never cross the power supply leads 14-1a and 14-1b (or the ground leads 14-2a and 14-2b), and a short-circuit therebetween is never created.

Also, in FIGS. 6 and 7, since the control signal circuit 4 including its pads 4a is arranged close to the data input/output circuit 2 including its pads 2a, the read/write speed can be increased. Further, since the data buses 5-1 and 5-2 are concentrated in the center portion of the device, the read/write speed can be equalized regardless of the memory cell arrays 1a, 1b, 1c and 1d.

As explained hereinbefore, according to the present invention, a short-circuit between the leads can be avoided without reducing the access time.

I claim:

1. A semiconductor memory device comprising:
   first, second, third and fourth memory cell arrays, said first and second memory cell arrays being arranged in a first row, said third and fourth memory cell arrays being arranged in a second row, said first and third memory cell arrays being arranged in a first column, said second and fourth memory cell arrays being arranged in a second column;

a data input/output circuit and data input/output pads arranged between said first memory cell array and said third memory cell array;

a control signal circuit and control signal pads arranged between said first memory cell array and said third memory cell array;

a first address signal circuit and first address signal pads arranged outside of said second memory cell array opposite to said fourth memory cell array;

a second address signal circuit and second address signal pads arranged outside of said fourth memory cell array opposite to said second memory cell array;

a first data bus arranged between said first memory cell array and said data input/output circuit, between said first memory cell array and said control signal circuit, and between said second memory cell array and said fourth memory cell array, said first data bus being connected to said first and second memory cell arrays and said data input/output circuit; and a second data bus arranged between said third memory cell array and said data input/output circuit, between said third memory cell array and said control signal circuit, and between said second memory cell array and said fourth memory cell array, said second data bus being connected to said third and fourth memory cell arrays and said data input/output circuit.

2. A semiconductor memory device comprising:

first, second, third and fourth memory cell arrays, said first and second memory cell arrays being arranged in a first row, said third and fourth memory cell arrays being arranged in a second row, said first and third memory cell arrays being arranged in a first column, said second and fourth memory cell arrays being arranged in a second column;

a data input/output circuit and data input/output pads arranged between said first memory cell array and said third memory cell array;

a control signal circuit and control signal pads arranged between said first memory cell array and said third memory cell array;

a first address signal circuit and first address signal pads arranged outside of said second memory cell array opposite to said fourth memory cell array;

a second address signal circuit and second address signal pads arranged outside of said fourth memory cell array opposite to said second memory cell array;

a first, power supply pad and a first ground pad arranged outside of said first and third memory cell arrays opposite to said second and fourth memory cell arrays;

a second power supply pad and a second ground pad arranged at an approximate center position among said first, second, third and fourth memory cell arrays; and a third power supply pad and a third ground pad arranged outside of said second and fourth memory cell arrays opposite to said first and third memory cell arrays.

3. A device as set forth in claim 2, further comprising a lead frame including:

data input/output leads extending from outside of said first and third memory cell arrays to a space between said first and third memory cell arrays, and being connected by bonding wires to said data input/output pads;

control signal leads extending from outside of said first and third memory cell arrays to the space between said first and third memory cell arrays, and being connected by bonding wires to said control signal pads;

address signal leads extending over said second and fourth memory cell arrays and being connected by bonding wires to said address signal pads;

a first power supply lead and a first ground lead extending from outside of said first and third memory cell arrays to the space between said first and second memory cell arrays and being connected by bonding wires to said first power supply pad and said first ground pad, respectively; and a second power supply lead and a second ground lead extending from outside of said second and fourth memory cell arrays to a space between said second and fourth memory cell arrays, and extending from a neighborhood of said second power supply pad and said second ground pad to a neighborhood of said third power supply pad and said third ground pad, said second power supply pin being connected by bonding wires to said second and third power supply pads, said second ground pin being connected by bonding wires to said second and third ground pads.

4. A semiconductor memory device comprising:

first, second, third and fourth memory cell arrays, said first and second memory cell arrays being arranged in a first row, said third and fourth memory cell arrays being arranged in a second row, said first and third memory cell arrays being arranged in a first column, said second and fourth memory cell arrays being arranged in a second column;

a data input/output circuit and data input/output pads arranged between said first memory cell array and said third memory cell array;

a control signal circuit and control signal pads arranged between said first memory cell array and said third memory cell array;

a first address signal circuit and first address signal pads arranged outside of said second memory cell array opposite to said fourth memory cell array; and a second address signal circuit and second address signal pads arranged outside of said fourth memory cell array opposite to said second memory cell array, wherein a distance between said first and third memory cell arrays is larger than a distance between said second and fourth memory cell arrays.

5. A semiconductor memory device comprising:

first, second, third and fourth memory cell arrays, said first and second memory cell arrays being arranged in a first row, said third and fourth memory cell arrays being arranged in a second row, said first and third memory cell arrays being arranged in a first column, said second and fourth memory cell arrays being arranged in a second column;

a data input/output circuit and data input/output pads arranged between said first memory cell array and said third memory cell array;

a control signal circuit and control signal pads arranged between said first memory cell array and said third memory cell array;

a first address signal circuit and first address signal pads arranged outside of said second memory cell array opposite to said fourth memory cell array; and a second address signal circuit and second address signal pads arranged outside of said fourth memory cell array opposite to said second memory cell array;

wherein said first and second memory cell arrays and said first address signal circuit are symmetrical to said third and fourth memory cell arrays and said second address signal circuit.

6. A semiconductor device comprising:

first, second, third and fourth circuit arrays, said first and second circuit arrays being arranged in a first row, said third and fourth circuits arrays being arranged in a second row, said first and third circuit arrays being arranged in a first column, said second and fourth circuit arrays being arranged in a second column, first pads arranged between said first circuit array and said third circuit array;

second pads arranged outside of said second circuit array opposite to said fourth circuit array;

third pads arranged outside of said fourth circuit array opposite to said second circuit array;

a first power supply pad and a first ground pad arranged outside of said first and third circuit arrays opposite to said second and fourth circuit arrays;

a second power supply pad and a second ground pad arranged at an approximate center position among said first, second, third and fourth circuit arrays;

a third power supply pad and a third ground pad arranged outside of said second and fourth circuit arrays opposite to said first and third circuit arrays;

first leads extending from outside of said first and third circuit arrays to a space between said first and third circuit arrays, and being connected by bonding wires to said first pads;

second leads extending over said second and fourth circuit arrays and being connected by bonding wires to said second pads;

a first power supply lead and a first ground lead extending from outside of said first and third circuit arrays to the space between said first and second circuit arrays and being connected by bonding wires to said first power supply pad and said first ground pad, respectively; and a second power supply lead and a second ground lead extending from outside of said second and fourth circuit arrays to a space between said second and fourth circuit arrays, and extending from a neighborhood of said second power supply pad and said second ground pad to a neighborhood of said third power supply pad and said third ground pad, said second power supply lead being connected by bonding wires to said second and third power supply pads, said second ground lead being connected by bonding wires to said second and third ground pads.

7. A device as set forth in claim 6 further comprising:

a first bus arranged between said first circuit array and said first pads and between said second circuit array and said fourth circuit array, said first bus being connected to said first and second circuit arrays and said first pads; and a second bus arranged between said third circuit array and said first pads and between said second circuit array and said fourth circuit array, said second bus being connected to said third and fourth circuit arrays and said first pads.

8. A device as set forth in claim 6, wherein a distance between said first and third circuit arrays is larger than a distance between said second and fourth circuit arrays.

9. A device as set forth in claim 6, wherein said first and second circuit arrays and said second pads are symmetrical to said third and fourth circuit arrays and said third pads.

* * * * *